(12) United States Patent
Pace et al.

(10) Patent No.: US 6,822,996 B1
(45) Date of Patent: Nov. 23, 2004

(54) MOUNT HAVING HIGH MECHANICAL STIFFNESS AND TUNABLE EXTERNAL CAVITY LASER ASSEMBLY INCLUDING SAME

(75) Inventors: David Ross Pace, San Jose, CA (US); Mark McDonald, Milpitas, CA (US); William B. Chapman, Santa Clara, CA (US); William J. Kozlovsky, Santa Clara, CA (US); John E. Sell, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/173,546

(22) Filed: Jun. 15, 2002

(51) Int. Cl.[7] ................................................. H04S 3/00
(52) U.S. Cl. ........................... 372/109; 372/20; 372/92; 372/99; 372/101
(58) Field of Search ............................... 372/20, 92, 99, 372/101, 109

(56) References Cited

U.S. PATENT DOCUMENTS

| | | | | |
|---|---|---|---|---|
| 5,329,539 A | * | 7/1994 | Pearson et al. | 372/36 |
| 5,361,636 A | * | 11/1994 | Farstad et al. | 73/592 |
| 5,760,808 A | * | 6/1998 | Wiedemer | 347/103 |
| 6,526,071 B1 | * | 2/2003 | Zorabedian et al. | 372/20 |
| 6,531,867 B1 | * | 3/2003 | Greene et al. | 324/262 |
| 6,600,760 B1 | * | 7/2003 | Green et al. | 372/20 |
| 6,665,321 B1 | * | 12/2003 | Sochava et al. | 372/20 |

* cited by examiner

Primary Examiner—Don Wong
Assistant Examiner—Delma R. Flores Ruiz
(74) Attorney, Agent, or Firm—Blakely, Sokoloff, Taylor & Zafman LLP

(57) ABSTRACT

A laser apparatus wherein all optical components are mounted on a unitary, rigid base. Natural frequency modes of the apparatus are above about 2 kHz. Tuning elements in the apparatus may have natural frequencies greater than about 10 kHz.

48 Claims, 7 Drawing Sheets

US 6,822,996 B1

MOUNT HAVING HIGH MECHANICAL STIFFNESS AND TUNABLE EXTERNAL CAVITY LASER ASSEMBLY INCLUDING SAME

BACKGROUND OF THE INVENTION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths, while effectively suppressing lasing associated with external cavity modes that are within the gain bandwidth of the cavity.

The mechanical design of an external cavity laser is an important factor in providing such a stable single mode output. The external laser cavity should be able to withstand shocks and vibration, during operation, with the ability to provide uninterrupted, stable, single mode output. The power of the laser must not drop by an appreciable amount as the laser undergoes a shock or vibration and it must not lose channel lock. These goals have been difficult to achieve, and there is accordingly a need for an external cavity laser that provides stable, single mode operation at selectable wavelengths and under adverse conditions such as shock or vibration. The present invention satisfies these needs, as well as others, and overcomes deficiencies found in the background art.

BRIEF DESCRIPTION OF THE DRAWINGS

The invention will be more fully understood by reference to the following drawings, which are for illustrative purposes only.

DETAILED DESCRIPTION OF PREFERRED EMBODIMENTS

Figure 1:
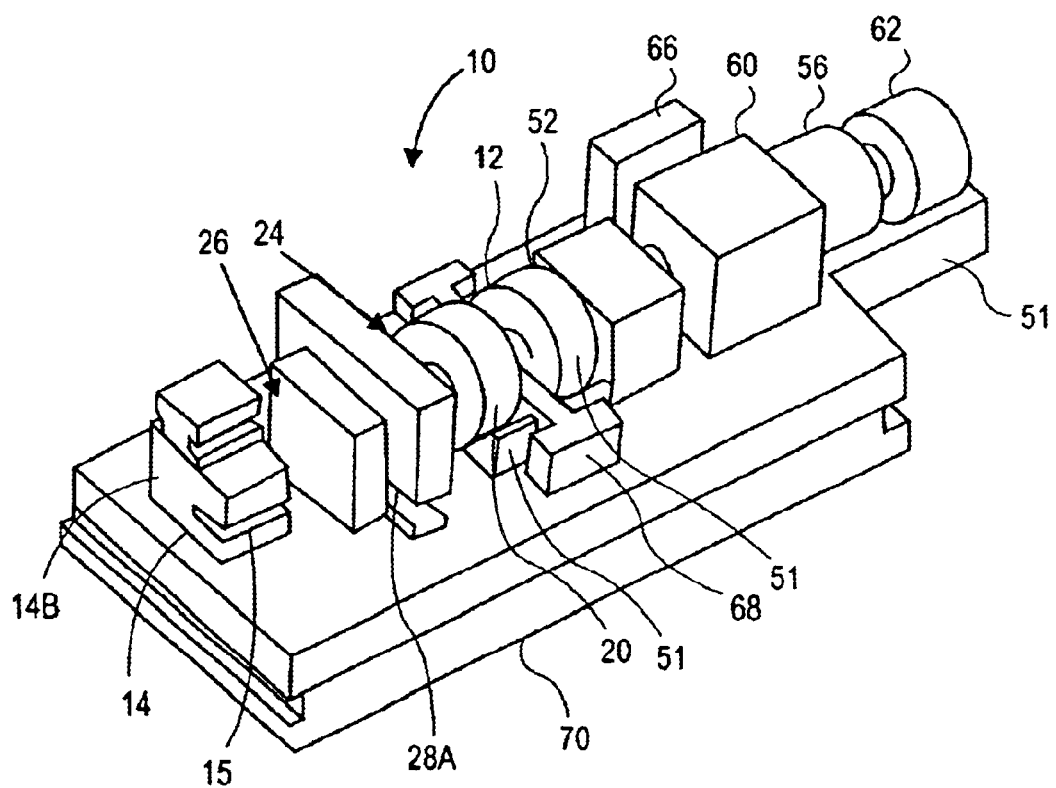
FIG. 1 is a perspective view of a tunable external cavity laser apparatus in accordance with the present invention.

The present invention relates to external cavity laser devices wherein a rigid unitary mount base is provided, on which all components are rigidly mounted, and wherein the natural modes of vibration of the apparatus are above about 2 kHz to provide improved reliability and robustness of the device when subjected to shock even when the apparatus is in operation.

A rigid unitary mount base serving as a platform for an external cavity laser apparatus is provided, which may be formed of a rigid, unitary plate of metal having a natural mode of vibration above about 2 kHz; and at least one cradle extending from a surface of the plate. Each cradle has a curvilinear support dimensioned to interface with a substantial portion of a peripheral surface of an optical component to be mounted to the base. The base may be formed of aluminum nitride, which, when integral, the cradle or cradles will also be formed of the same. The cradle or cradles may be formed of the same or another rigid material in embodiments where the cradles are fixed to the plate.

A laser apparatus is provided which includes a rigid unitary mount base; a gain medium rigidly mounted with respect to the mount base in a position defining a first end of an external cavity; a reflector rigidly mounted with respect to the mount base in a position defining a second end of the external cavity; at least one tuning element rigidly mounted with respect to the mount base in the external cavity between the gain medium and the reflector; a collimator rigidly mounted with respect to the mount base, between the first facet of the gain medium and at least one tuning element; and an optical output assembly rigidly mounted to the mount base and optically coupled to the second facet of the gain medium; wherein the natural modes of vibration of said apparatus are above about 2 kHz. The apparatus is arranged to have no mechanically moving parts, so as to eliminate natural modes of vibration below about 2 kHz.

The tuning element or elements may be thermo-optically tunable, and may have resonant frequencies greater than about 10 kHz.

A carrier may be provided, upon which the tuning element or elements are mounted prior to mounting the carrier to the mount base, to enhance the rigidity with which the tuning elements are mounted.

A rigid block and a phase compensator may be provided to enhance the rigidity with which the reflector is mounted. In this arrangement, the reflector is mounted to the phase compensator, and the phase compensator is mounted to the rigid block prior to mounting the rigid block to the mount base.

Further, a rigid mount may be provided for mounting the gain medium thereto, prior to mounting the rigid mount to the mount base. The rigid mount may be a dog bone or "I"-shaped mount or, in certain embodiments, a "T"-shaped mount. The rigid mount may comprise aluminum nitride, copper-tungsten, or other material.

The optical assembly may include a second collimator rigidly mounted to the mount base adjacent the second facet of the gain medium and optically coupled therewith; a fiber focus lens adapted to focus optical output from the laser apparatus for delivery to an optical fiber; and a ferrule adapted to connect the optical fiber to the laser apparatus for delivery of the focused optical output therethrough.

The rigid unitary mount base may include a cradle having a curvilinear support dimensioned to interface with a substantial portion of a peripheral surface of the second collimator; and at least one additional cradle having a curvilinear support dimensioned to interface with substantial portions of peripheral surfaces of the fiber focus lens and the ferrule.

The optical output assembly may further include an isolator optically coupled with an output side of the second collimator, a beam splitter mounted to receive an output from the isolator and to output a first beam to the fiber focus lens and a second beam at an angle to the first beam; and a power monitor mounted to receive the second beam.

Each component of the laser apparatus is rigidly mounted to the mount base, using epoxy or solder, for example to provide an apparatus having overall rigidity, with no modes of natural vibration below about 2 kHz.

Referring more specifically to the drawings, for illustrative purposes the present invention is embodied in the apparatus shown in FIGS. 1 through 8. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. It should also be understood that the terminology used herein is for the purpose of describing particular embodiments only, and is not intended to be limiting, since the scope of the present invention will be limited only by the appended claims. The relative sizes of components and distances therebetween as shown in the drawings are in many instances exaggerated for reason of clarity, and should not be considered limiting.

The current invention provides tunable laser cavity assemblies in which the natural modes of vibration (i.e., resonant frequencies) of each entire assembly, as well as each individual component of each assembly are of high stiffness, e.g., greater than about 2 kHz Non-moving thermal wavelength tuning elements having very high natural frequencies are employed, e.g., on the order of greater than about 10 kHz.

Figure 2:
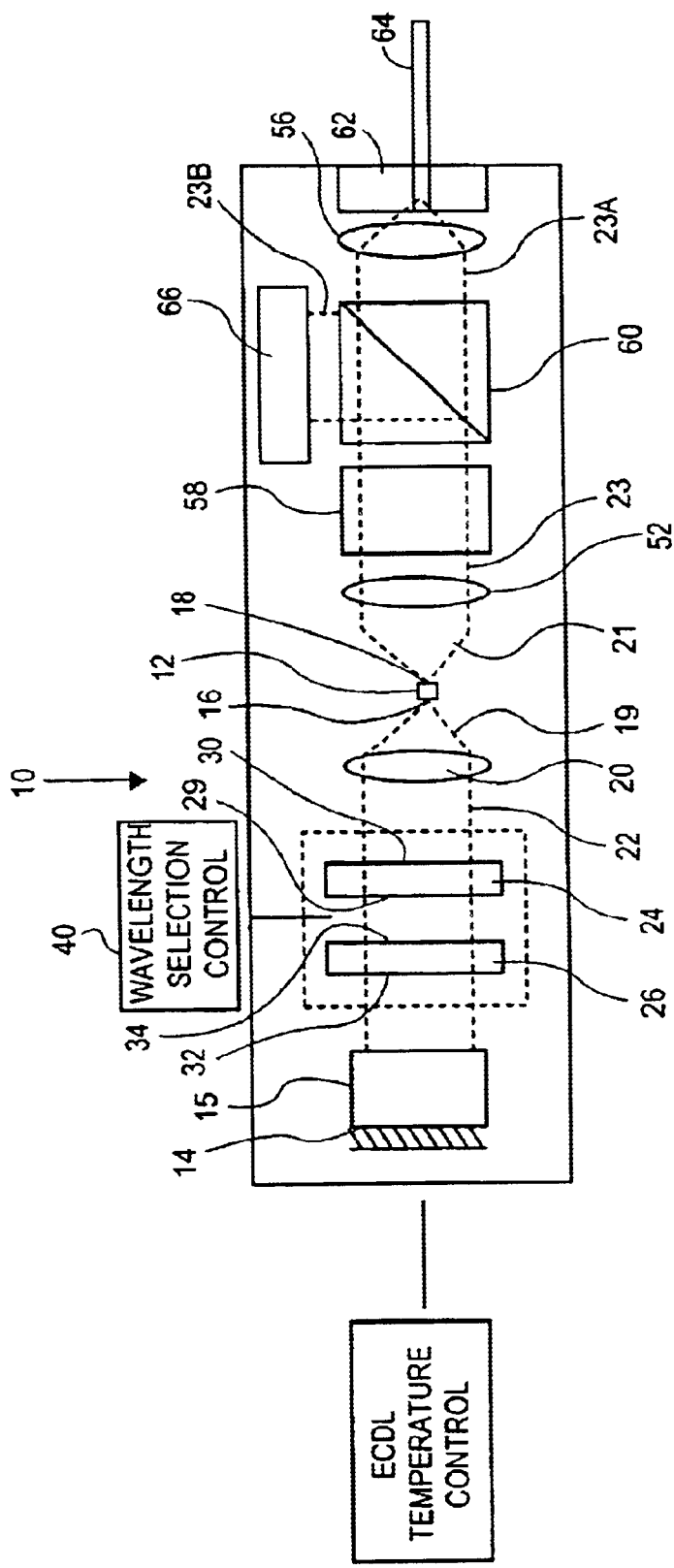
FIG. 2 is a schematic representation of a tunable external cavity laser apparatus in accordance with the present invention, with the primary components of the apparatus shown mounted to a rigid mounting base.

Referring now to FIG. 1 and FIG. 2, there is shown a laser apparatus 10 in accordance with the present invention. The apparatus 10 includes a gain medium 12 and an end or external reflective element 14. Gain medium 12 may comprise a conventional Fabry-Perot diode emitter chip and has an anti-reflection (AR) coated front facet 16 and a reflective or partially reflective rear facet 18 (see FIG. 2). Reflective element 14 may comprise a mirror or other reflective or retroreflective element associated with or mounted on a phase compensator 15, which may be formed as a block of lithium niobate or other electro-optic material. Phase compensator 15 is configured to physically stabilize the end reflector 14 by providing a large surface area which is mounted to L-shaped block 14b by epoxy or other adhesive, solder or mounting technique.

L-shaped block 14b is formed from a rigid material, which may be copper or a copper alloy, for its thermal expansion properties, for example, or aluminum nitride or other rigid metal. Block 14b also provides a large surface area which interfaces and is bonded to mount base 50. L-shaped block 14b, when mounted to base 50, is in thermal communication therewith, as well as being rigidly fixed with respect thereto. Mount base 50 is a unitary piece of highly stiff or rigid material, such as aluminum nitride, for example, and may be dimensioned as required for specific embodiments of the invention. In certain embodiments, mount base may have a thickness of between about one and two millimeters. Base 50 is thermally controlled by a thermal electric cooler (not shown, preferably, a single thermal electric cooler) that is in thermal communication with the underside of base 50.

An external laser cavity is delineated by rear facet 18 and reflective element 14. Gain medium 12 emits a first cohererit light beam 19 from front facet 16 that is collimated by lens/collimator 20 to define an optical path 22. Gain medium 12 also emits a second coherent beam 21 from the second facet 18, which is collimated by lens/collimator 52 to form a second optical path 23. Phase compensator 15 is electro-optically controllable to provide for laser external cavity length adjustment during laser operation. Selective heating and cooling of block 14b may also be used to control the position of reflector 14, and hence the external laser cavity length. The use of electro-optic and thermal tuning of an external laser cavity are described in U.S. patent application Ser. Nos. 09/900,426 and 09/900,443, the disclosures of which are incorporated herein by reference.

First and second tunable wavelength selection elements 24, 26 are positioned within the external cavity between the reflective element 14 and facet 18 and aligned with the optical path 22. Tunable elements 24, 26 are operable together to preferentially feed back light of a selected wavelength to gain medium 12 during operation of the laser apparatus 10. For exemplary purposes, tunable elements 24, 26 are shown in the form of first and second Fabry-Perot etalons, which may be tuned by precise dimensioning of etalon optical path length. Other etalons, such as etalons which may comprise parallel plate solid, liquid or gas spaced etalons, for example, or other types of wavelength selection elements such as gratings, prisms and/or filters may alternatively be used in place of, or together with etalons 24, 26. Wavelength selection elements used wit the invention preferably comprise high stiffness materials (i.e., natural frequency at least above 2 kHz, preferably above 10 kHz) so that they can be fixedly mounted to base mount 50 in an assembly having an overall natural frequency greater than about 2 kHz. Furthermore, although the illustrated embodiments show the use of a pair of tuning elements, a single tuning element or more than two tuning elements may be employed.

First etalon 24 includes faces 28, 30, and has a first free spectral range $FSR_1$ according to the spacing between faces 28, 30 and the refractive index of the material of etalon 24. Second etalon 26 includes faces 32, 34, and has a second free spectral range $FSR_2$ defined by to spacing between faces 32, 34 and the refractive index of the material of etalon 26. Etalons 24, 26 may comprise the same material or different materials with different refractive indices.

Etalons 24, 26 each are tunable by adjustment of their optical thickness, to provide for adjustment or tuning of FSR$_1$ and FSR$_2$, which in turn provides selective wavelength tuning for the laser apparatus 10. Tuning of etalons 24, 26 may involve adjustment of the distance between faces 28, 30 and 32, 34 and/or adjustment of the refractive index of the etalon material, and may be carried out using various techniques, including thermo-optic, electro-optic, acousto-optic and piezo-optic tuning to vary refractive index, as well as thermal tuning to vary the spacing of etalon faces. More than one such tuning effect may be applied simultaneously to one or both etalons 24, 26, depending upon the particular embodiment of the invention.

In the embodiment shown in FIG. 1, first and second etalons 24, 26 each comprise silicon or other semiconductor material, and are tunable by thermo-optic effect. The term "thermo-optic" tuning means tuning by temperature-induced change in etalon material refractive index, temperature induced change in the physical thickness of an etalon, or both. The etalon materials used in certain embodiments have temperature dependent refractive indices as well as coefficients of thermal expansion such that thermo-optic tuning involves simultaneous thermal control of etalon material refractive index as well as thermal control of etalon physical thickness by selective heating or cooling.

Figure 3:
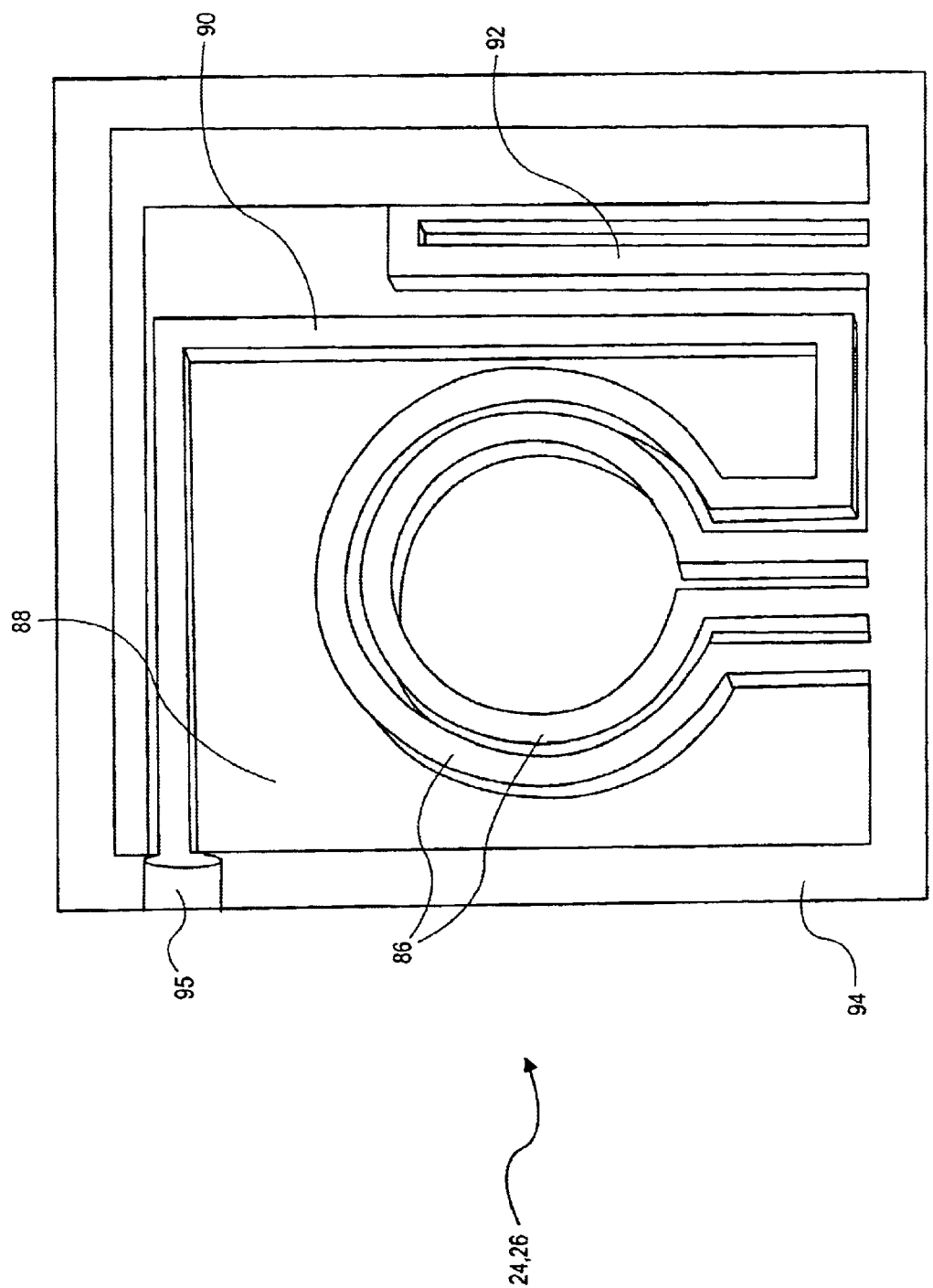
FIG. 3 is a schematic view of a silicon etalon with a thermal control element thereon.
Figure 4:
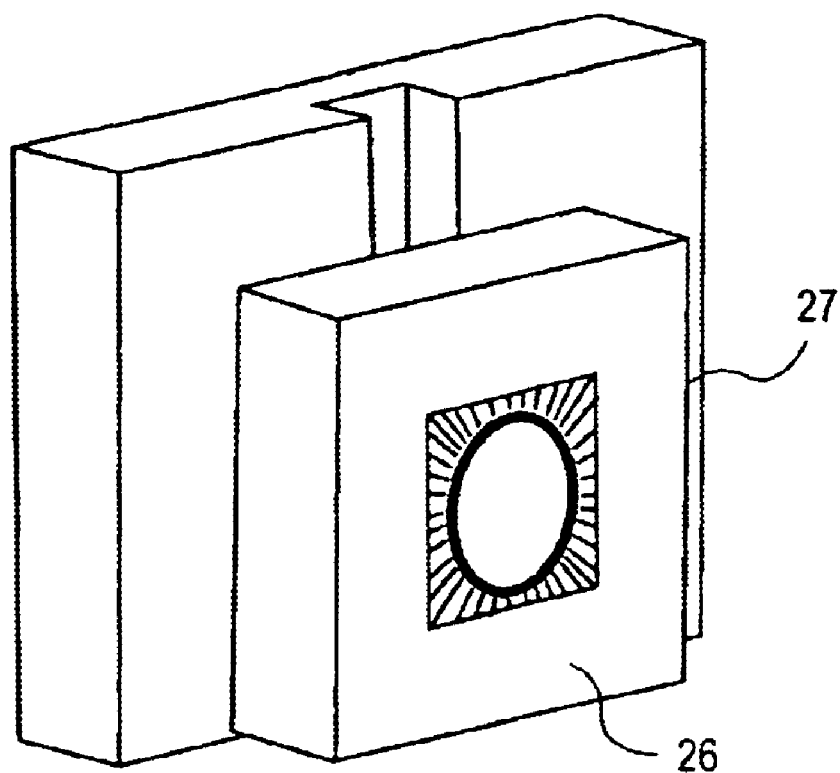
FIG. 4 is a perspective view of an etalon mounted to a carrier according to the present invention.

Microfabrication techniques for silicon can allow integration of tuning functions directly onto the etalon. Referring to FIG. 3, there is shown a silicon etalon 24/26 with a thermal control element 86 located on face 88 of etalon 24/26. Thermal control element 86 as shown is circular in shape to accommodate passage of a light beam (not shown) through the center of thermal control element 86. Thermal control element 86 comprises a conductive material that heats up upon application of current to provide the temperature change to tuning elements 24/26 required for thermo-optic tuning as described above. Conductors 90, 92 electrically connect thermal control element 86 to a current source (not shown). A temperature monitoring device such as a thermistor (not shown) may be integrated onto each tuning element 24/26 or one or more temperature monitoring devices may be located remotely from tuning elements 24/26.

Thermal control element 86 and conductors 90, 92 may be formed on etalon surface 88 by a variety of photolithographic and material deposition techniques. For example, a photoresist (not shown) may be applied to surface 88, patterned according to the configuration of control element 86 and conductors 90, 92, and developed to remove the exposed photoresist. The conductor material may then be deposited in developed pattern, and the remaining photoresist stripped from surface 88 to provide thermal control element 86 and conductors 90, 92 as shown in FIG. 3. Alternatively, the surface 88 may be etched in a pattern corresponding to thermal control element 86 and conductors 90, 92, and conductor material deposited in the groove to provide a thermal control element 86 and conductors 90, 92 that are recessed with respect to surface 88. In still other embodiments, thermal control element 88 may comprise a transparent conductive layer made of indium-tin oxide (ITO). Diffused resistors and traces of various configurations may be formed directly into the silicon etalon 24/26 using known techniques.

Etalons 24,26 are preferably mounted in a frame 94. Frame 94 may be micro-machined from silicon as well, so that frame 94 and etalon 86 have matching coefficients of thermal expansion. High thermal diffusivity in frame 94 promotes or enhances symmetry in the temperature across etalon 24/26 and avoids uneven heating or cooling of etalon 24/26 during tuning. Frame 94 and etalon 24/26 may be derived from the same bulk silicon substrate or from different silicon substrates. Frame 94 also provides a convenient location for a temperature probe 95 for monitoring the temperature of etalon frame 94, and frame 94 also serves as a thermal reservoir for thermal control of etalon 24/26.

To provide thermo-optic tuning, conductors 90, 92 of each tuning element 24, 26 are electrically connected to a controller 40. Controller 40 may comprise a conventional data processor, and provides tuning signals to thermal control elements 86 for thermal adjustment or tuning of etalons 24, 26 according to selectable wavelength information stored in a look-up table or other wavelength selection criteria. Etalons 24, 26 also may includes a temperature monitoring elements 95, 39 operatively coupled to controller 40 that can monitor etalon temperature during laser operation and communicate etalon temperature information to controller 40. Each thermal control element 86 allows adjustment of etalon temperature according to instructions from controller 40.

Thermal control of etalons 24,26 by thermal control elements 86 may be achieved by conduction, convection or both. In many embodiments, thermal conduction is the dominant pathway for heat flow and temperature adjustment of etalons 24, 26, and convective effects, which may result in unwanted or spurious thermal fluctuation in the etalons 24, 26, should be suppressed. The external cavity laser apparatus 10 may be designed or otherwise configured to allow or compensate for the effects of heat flow by thermal convection, over the operational temperature of the laser. For example, the apparatus 10 may be configured to restrict air flow near etalons 24, 26. In other embodiments etalons 24,26 may be individually isolated in low conductivity atmospheres or vacuum. Large air paths to structures of dissimilar temperature that are near to etalons 24,26, and the use of thermally insulating materials for components that are proximate to etalons 24, 26, can also be used to suppress unwanted heat transfer to or from etalons. The design of the apparatus 10 may additionally be configured to provide laminar air or atmosphere flow proximate to etalons, which avoids potentially deleterious thermal effects associated with turbulence.

Thermal control elements 86 allow each etalon 24, 26 to be subject to independent thermal control. Thermal control elements 86 can be used to provide common or parallel heating (both etalons heated or cooled at substantially the same rate of temperature change) as well as differential heating (etalons are heated or cooled at a substantially different rate of temperature change) for wavelength tuning as described below. Thermal control elements 86 may be integrated onto a face or faces each etalon 24, 26 as described above. Thermal control elements 86 may be associated with heat sinks or reservoirs (not shown) to allow rapid heating and cooling of etalons 24, 26.

In certain embodiments, etalons 24, 26 may be structured and configured such that a single thermal control clement or heat sink can simultaneously provide effective tuning of both etalons 24, 26. Thermal sensors or monitors (not shown) may be positioned on etalons 24, 26 or located remotely therefrom, to monitor etalon temperature for controller 40. The etalons 24, 26 may be joined or related by a sub-assembly (not shown) in which etalons 24, 26 are positioned or angled with respect to each other in a manner that avoids unwanted optical coupling between etalons 24, 26. Mounting of etalons 24, 26 with materials of suitable thermal properties can prevent undesired thermal coupling between etalons 24, 26 during tuning.

Further information regarding tuning element construction and thermo-optic tuning can be found in commonly owned, co-pending application Ser. No. 10/099,649, titled "Tunable External Cavity Laser", filed on Mar. 15, 2002, which is incorporated herein, in its entirety, by reference thereto.

Figure 5:
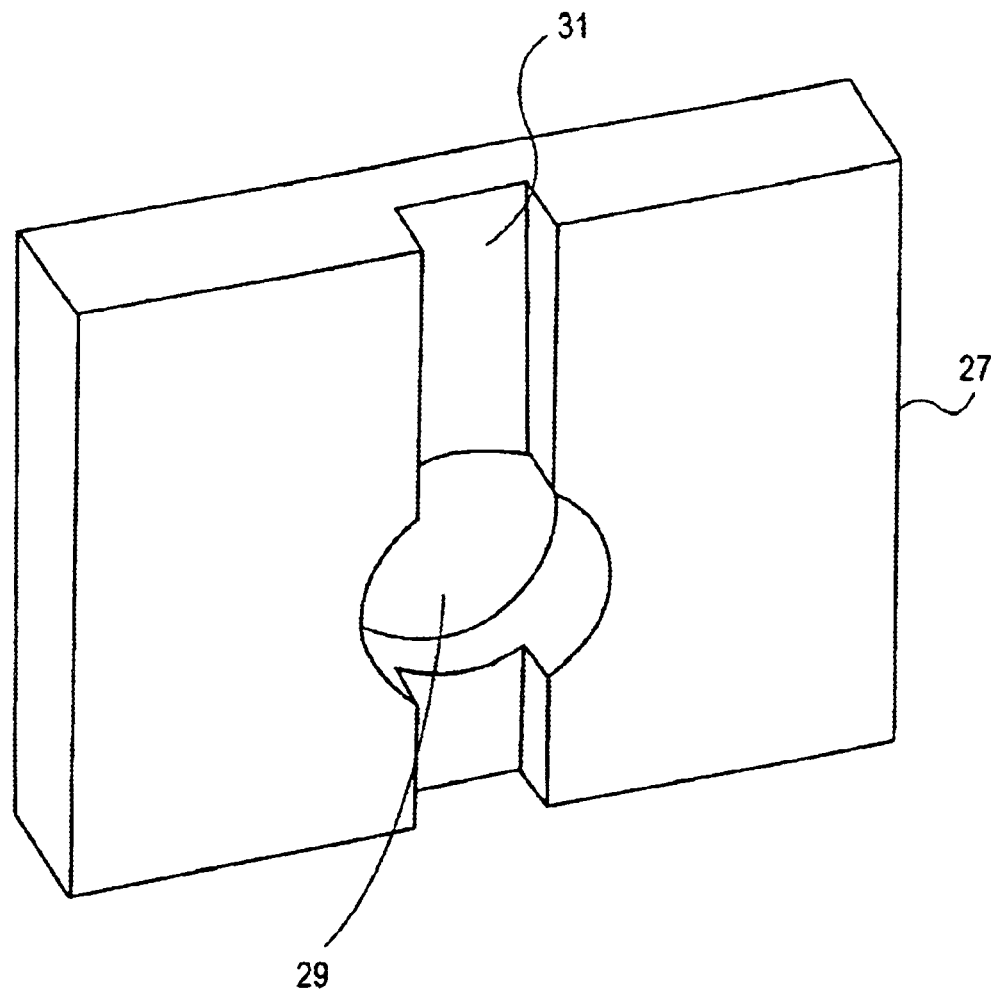
FIG. 5 is a perspective view of a carrier upon which tuning elements are to be mounted, according to the present invention.

Frames 94 of etalons 24,26 are bonded to opposite sides of a carrier 27 (see FIGS. 1, 4 and 5) prior to mounting the carrier 27 to base 50. Carrier 27 has a coefficient of thermal expansion that is substantially matched to that of the etalons 24,26 and frames 94, and thus may comprise silicon for use in carrying silicon etalons. Carrier 27 also has a central opening 29 (See FIG. 5) to provide a beam path and accommodate the light beam 19 traveling beam 22 path. Opening 29 and slot 31 (FIG. 5 provide for pressure equalization and allow free thermal convection of surrounding atmosphere through slot 31 and opening 29. Carrier 27 has a large surface area that interfaces with base 50 upon mounting, forming a highly rigid interconnection of the etalons 24,26 to the base mount 50. The carrier 27 (as well as all other features mounted to base 50) has a low aspect ratio to provide for stable mounting on base mount 50. The aspect ratio may, for example, be in range of from about 5:1 to about 2:1 (height to width).

Figure 6:
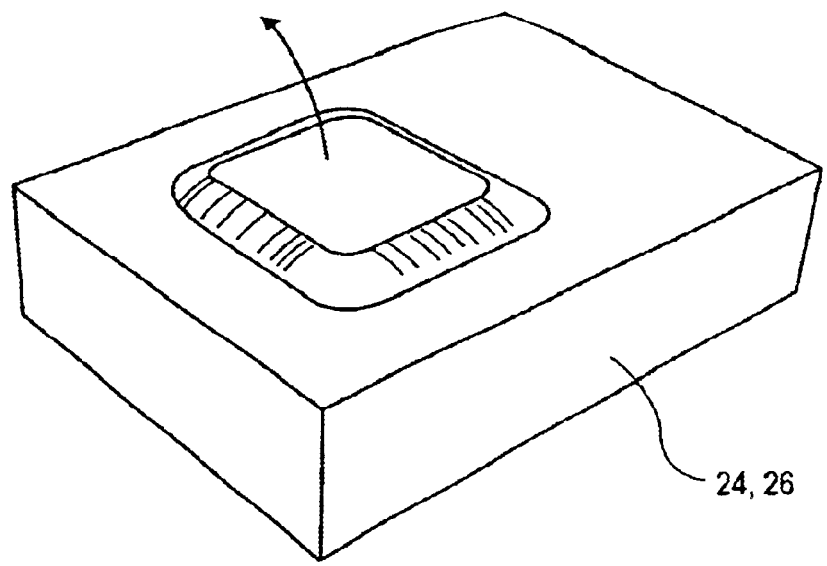
FIG. 6 is a perspective view of a finite element analysis of a tuning element, according to the present invention, resonating at its "drum mode".
Figure 7:
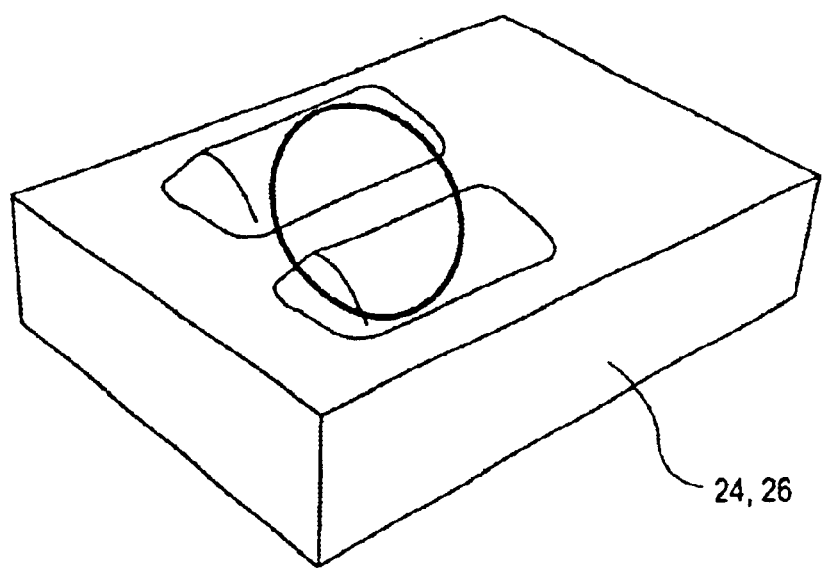
FIG. 7 is a perspective view of a finite element analysis of a tuning element, according to the present invention, resonating at its "torsional mode".
Figure 8:
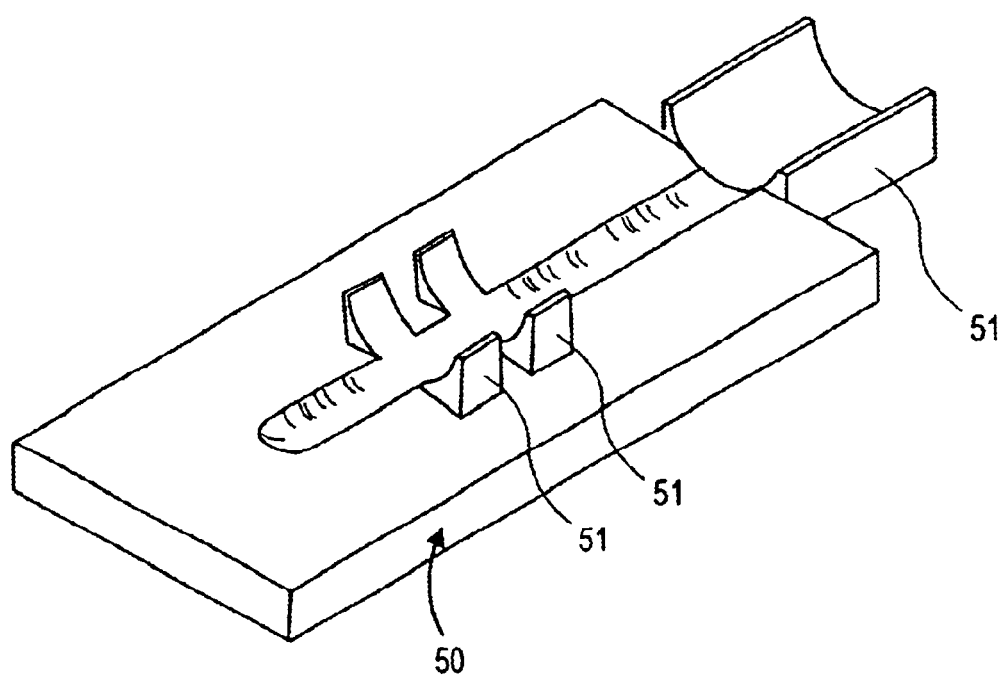
FIG. 8 is a perspective view of a unitary, rigid mounting base for an external cavity laser apparatus according to the present invention.

The etalons 24,26 in the embodiment of FIG. 1 are designed to each have a natural frequency above about 10 kHz. FIG. 6 is a perspective view of the first, or lowest mode of vibration, of a finite element analysis of the etalon 24,26 shown in its resonant "drum mode" with a resonance of about 15 kHz with direction indicated by the arrow. FIG. 7 is a perspective view the second mode of vibration of a finite element analysis of etalon 24,26 shown in a "torsion mode" of 30 kHz. The input force required to drive these resonances of the etalon structure must include energy within the spectral range of these mechanical resonances. The higher the frequency of the vibration modes, the shorter the shock pulse duration that is required to excite those modes of vibration within the structure. Modes higher than 2 kHz will not be excited as much from those short pulses experienced within a real "field" condition, which can tend to be of order of less than 1 ms in pulse width. For the purposes of finite element analysis (FEA), the input signal to the model is selected to include adequate energy to qualitatively define the resonance characteristics of the etalon structure. The input may be in the form of a swept sine vibration input or a short duration pulse that provides adequate energy out to the resonance activity of interest. The resonance frequency can be identified by input force in either x or y directions, and swept time sine vibration input may be used.

Upon feeding back light of a selected wavelength from tunable elements 24, 26 to gain medium 12 during operation of the laser apparatus 10, the gain medium begins to lase at the wavelength of the light that is fed back from the tunable elements to the gain medium 12. A beam 21 at the selected wavelength is emitted from facet 18 as an output to collimator 52. The collimator 52 directs the output beam along a second optical path 23 to an optical isolator 58 to provide feedback suppression (isolation).

The beam then travels along optical path 23 to a beam splitter 60, which divides the beam into two optical paths 23a and 23b. Path 23a continues to fiber focusing lens 56, which focuses the beam into an optical fiber 64 supported by fiber ferrule 62. A second beam outputted from beam splitter along optical path 23b is directed to power monitor 66, which monitors the output power of the apparatus and provides feedback to ensure a consistent power level is maintained. Power monitor 66 may comprise a conventional photodetector. Collimator 52, isolator 58, beam splitter 60, detector 66 and focusing lens 56 function as an optical output assembly for the apparatus 10. However, the present invention is not necessarily limited to such an arrangement. For example, the beam splitter 60 and power monitor 66 could be omitted in some configurations. Also various arrangements of collimators, lenses, etc., with or without an isolator could be substituted.

All of the above described components are mounted on a single integral mounting base 50, as shown in FIG. 1. A single thermal electric controller 70 is thermally coupled to mount 50 under the entire assembly for maintaining a controlled operating temperature of the components mount 50. The tunable elements 24,26 are subject to separate thermal control as described above. Etalons 24, 26 may utilize mount 50 as a heat sink in some embodiments.

Gain medium 12 is thermally coupled to thermoelectric controller 70 via thermally conductive platform 50 and carrier 68, and may be temperature adjusted, by heating or cooling introduced from the thermoelectric controller 70, to adjust gain medium refractive index, and hence external cavity optical path length. Since both gain medium 12 and end reflector 14 are mounted on a single thermally controlled platform 50, the material of platform 50 may be selected to provide a coefficient of thermal expansion such that heating and cooling of platform 50 provides a corresponding expansion and contraction of platform 50 to adjust the physical separation of gain medium facet 18 and end reflector 14, and hence provide adjustment of the external cavity optical path length. The adjustment of the spacing of gain medium facet 18 and end reflector 14 in this manner may be carried out together or simultaneously with thermal adjustment of gain medium refractive index. Alternatively, gain medium 12 may be thermally isolated from platform 50 such that thermal adjustment of external cavity optical path length is carried out by spacing of gain medium facet 12 and end reflector 14 alone. The use of temperature control of external cavity optical path length is also described in the U.S. Patent Application Ser. No. 10/173,355 entitled "EXTERNAL CAVITY LASER APPARATUS AND METHODS" to inventors Andrew Daiber et al., simultaneously co-filed herewith, the disclosure of which is incorporated herein by reference.

Facets 16, 18 of gain medium 12 and retroreflective element 14 represent alignment-sensitive optical surfaces of the apparatus 10 for which placement is critical. Although many, if not all of the components in the assembly are alignment-sensitive, placement of the gain medium 12 (and hence, the facets 16 and 18) and the retroreflective element 14 are particularly critical as to their spacing, as this is what defines the length of the external cavity, as described above. For these reasons, the L-shaped member 14b and "dog bone"-shaped carrier or mounting element 68 are soldered to the base 50, using a solder which may be CTE (coefficient of thermal expansion)-matched to each particular component. By using solder, there is more assurance of the components 14b, 68 retaining their exact placement on base 50, whereas epoxy or other adhesive or means of attachment increase the risk of shifting of the components after placing them, such as during curing of the adhesive, for example.

The gain medium 12 is mounted on the dog bone element 68 prior to mounting the carrier 68 to the base 50. The gain medium 12 may be coupled to the dog bone element 68 by a thermally conductive adhesive or solder which may be CTE-matched to the gain medium 12 and carrier 68. A further description of the carrier element 68 and its functions can be found in commonly owned co-pending application Ser. No. 10/173,545 titled "Chip Carrier Apparatus" to inventors Kozlovsky et al., which is being filed concurrently herewith and which is incorporated herein, in its entirety, by reference thereto.

End reflector 14 comprises a reflective surface on the phase compensator 15, which is mounted to the L-shaped carrier 14b prior to mounting the L-shaped carrier 14b to the base 50. The L-shaped carrier 14b is positioned on the base for accurate alignment with the optical path 22 as well as for accurate distance from the gain medium 12 for the desired external cavity length. The L-shaped carrier 14b may be soldered in place while monitoring output power from the apparatus 10 using detector 66, in order to ensure the optimum placement of carrier 14b.

As noted above, the tuning elements 24, 26 are mounted to carrier 27, such as with thermally conductive epoxy, prior to mounting the carrier 27 to base 50. The carrier 27 may be soldered to the base with CTE matched solder, but may alternatively be mounted using thermally conductive epoxy. The broad mounting surface of the carrier and low aspect ratio ensure a rigid placement of the tuning elements and protect from vibrations up to 2 kHz with the tuning elements 24,26 preferably being free from vibration up to at least 10 kHz.

Collimator lenses 20 and 52 are mounted on opposite sides of the gain medium 12/dog bone element 68, as shown in FIG. 1, using a thermally conductive epoxy, for example. In addition to the relatively large width of the lenses themselves providing a substantially surface area for bonding to the base 50, the base 50 is further provided with curvilinear supports, saddles or cradles 51 which are dimensioned to interface with a substantial portion of the peripheral surface of each lens, thereby substantially increasing the surface area that is bonded and substantially increasing the robustness and rigidity of the lenses 20 and 52 with respect to the base 50. Supports 51 are formed of a highly rigid material and may be, but are not necessarily, formed of the same material as base 50, such as aluminum nitride, for example. Supports 51 may be an integral portion of the base 50 or may be mounted thereto using thermally conductive epoxy, solder, or other means of affixation, such as mechanical means, for example. The curvature of each support 51 is matched to the curvature of the lens it is intended to support, and is generally designed to provide a tolerance (e.g., about 0.001", for example) between the support and lens to accommodate the volume of the epoxy.

Isolator 58, beam splitter 60 and power monitor 66 are all formed with large base surface areas to provide a large surface area for bonding these components to base 50.

What is claimed is:

1. A laser apparatus comprising:
   a rigid unitary mount base;
   a gain medium rigidity mounted with respect to said mount base in a position defining a first end of an external cavity, said gain medium having first and second output facets;
   a reflector rigidity mounted with respect to said mount base in a position defining a second end of said cavity;
   at least one tuning element rigidly mounted with respect to said mount base in said external cavity between said gain medium and said reflector;
   a collimator rigidly mounted with respect to said mount base, between said first facet of said gain medium and said at least one tuning element; and
   an optical output assembly rigidly mounted to said mount base and optically coupled to said second facet of said gain medium;

wherein the natural modes of vibration of said apparatus are above about 2 kHz.

2. The laser apparatus of claim 1 wherein said at least one tuning element is thermo-optically tunable and contains no mechanically moving parts.

3. The laser apparatus of claim 2, wherein said at least one tuning element has a resonant frequency greater than about 10 kHz.

4. The laser apparatus of claim 2, further comprising a carrier rigidly mounted to said mount base, said at least one tuning element being mounted on said carrier.

5. The laser apparatus of claim 1, wherein said at least one tuning element comprises a pair of tuning elements.

6. The laser apparatus of claim 5, further comprising a carrier rigidly mounted to said mount base, said at pair of tuning elements being mounted on said carrier.

7. The laser apparatus of claim 5 wherein said pair of tuning element are thermo-optically tunable and contain no mechanically moving parts.

8. The laser apparatus of claim 7, wherein each of said pair of tuning elements has a resonant frequency greater than about 10 kHz.

9. The laser apparatus of claim 6, wherein said pair of tuning elements comprise silicon etalons and said carrier comprises silicon.

10. The laser apparatus of claim 9 wherein said carrier is mounted to said base with a thermally conductive epoxy.

11. The laser apparatus of claim 1, wherein said rigid unitary mount base comprises aluminum nitride.

12. The laser apparatus of claim 1, further comprising a thermal electric cooler thermally coupled to said rigid, unitary base.

13. The laser apparatus of claim 1, further comprising a rigid block and a phase compensator, said reflector being mounted to said phase compensator, said phase compensator being mounted to said rigid block and said rigid block being mounted to said mount base in a precise position to accurately place said reflector in said position defining a second end of said external cavity.

14. The laser apparatus of claim 13, wherein said rigid block comprises an L-shaped block.

15. The laser apparatus of claim 13, wherein said rigid block is soldered to said mount base.

16. The laser apparatus of claim 15, wherein the solder used to solder said rigid block to said mount base comprises a solder having a coefficient of thermal expansion that is matched to a coefficient of thermal expansion of at least one of said rigid block and said mount base.

17. The laser apparatus of claim 13, wherein said rigid block comprises aluminum nitride.

18. The laser apparatus of claim 13, wherein said phase compensator comprises lithium niobate.

19. The laser apparatus of claim 1, further comprising a rigid mount to which said gain medium is mounted, said rigid mount being soldered to said mount base.

20. The laser apparatus of claim 19, wherein said rigid mount comprises aluminum nitride.

21. The laser apparatus of claim 19, wherein said rigid mount comprises a dog bone mount.

22. The laser apparatus of claim 20, wherein said dog bone mount comprises aluminum nitride.

23. The laser apparatus of claim 19, wherein the solder used to solder said rigid mount to said mount base comprises a solder having a coefficient of thermal expansion that is matched to a coefficient of thermal expansion of at least one of said rigid mount and said mount base.

24. The laser apparatus of claim 1, wherein said rigid unitary mount base comprises a cradle having a curvilinear support dimensioned to interface with a substantial portion of a peripheral surface of said collimator.

25. The laser apparatus of claim 24, wherein said cradle is an integral portion of said rigid unitary mount base.

26. The laser apparatus of claim 25, wherein said rigid unitary mount base, including said cradle, comprises aluminum nitride.

27. The laser apparatus of claim 24, wherein said cradle is fixed to said rigid unitary mount base.

28. The laser apparatus of claim 27, wherein said cradle comprises stainless steel.

29. The laser apparatus of claim 24 wherein said collimator is mounted to said cradle with a thermally conductive epoxy.

30. The laser apparatus of claim 1, wherein said optical output assembly includes a second collimator rigidly mounted to said mount base adjacent said second facet of said gain medium and optically coupled therewith; a fiber focus lens adapted to focus optical output from the laser apparatus for delivery to an optical fiber; and a ferrule adapted to connect an the optical fiber to the laser apparatus for delivery of the focused optical output therethrough.

31. The laser apparatus of claim 30, wherein said rigid unitary mount base comprises a cradle having a curvilinear support dimensioned to interface with a substantial portion of a peripheral surface of said second collimator; and at least one additional cradle having a curvilinear support dimensioned to interface with substantial portions of peripheral surfaces of said fiber focus lens and said ferrule.

32. The laser apparatus of claim 31, wherein each said cradle is an integral portion of said rigid unitary mount base.

33. The laser apparatus of claim 32, wherein said rigid unitary mount base, including said cradles, comprises aluminum nitride.

34. The laser apparatus of claim 31, wherein at least one of said cradles is fixed to said rigid unitary mount base.

35. The laser apparatus of claim 34, wherein at least one of said cradles comprises stainless steel.

36. The laser apparatus of claim 31, wherein said second collimator, fiber focus lens and ferrule are mounted to said cradles, respectively, with a thermally conductive epoxy.

37. The laser apparatus of claim 31 wherein said second collimator and said fiber focus lens are mounted to said cradles, respectively, with a thermally conductive epoxy; and said ferrule is soldered to said respective cradle.

38. The laser apparatus of claim 37, wherein the solder used to solder said ferrule to said cradle comprises a solder having a coefficient of thermal expansion that is matched to a coefficient of thermal expansion of at least one of said cradle and said ferrule.

39. The laser apparatus of claim 30, wherein said optical output assembly further includes an isolator optically coupled with an output side of said second collimator, a beam splitter mounted to receive an output from said isolator and to output a first beam to said fiber focus lens and a second beam at an angle to said first beam; and a power monitor mounted to receive said second beam.

40. The laser apparatus of claim 39, wherein each of said isolator, beam splitter and power monitor are bonded to said rigid unitary base with thermally conductive epoxy.

41. An external cavity laser apparatus comprising:

a gain medium;

a reflective element mounted in a position to define an external cavity between said reflective element and said gain medium;

means for tuning positioned in said external cavity;

an optical output assembly outside of said external cavity and optically coupled to said gain medium; and a rigid unitary mount base, wherein each of said gain medium, reflective element, means for tuning, and optical output assembly are rigidly mounted with respect to said rigid unitary mount base, and wherein the natural modes of vibration of said apparatus are above about 2 kHz.

42. An external laser cavity apparatus comprising:

a gain medium;

a reflective element mounted in a position to define an external cavity between said reflective element and said gain medium;

a tuning element for tuning positioned in said external cavity;

an optical output assembly outside of said external cavity and optically coupled to said gain medium; and a rigid unitary mount base, wherein each of said gain medium, reflective element, tuning element, and optical output assembly are rigidly mounted with respect to said rigid unitary mount base, and wherein the natural modes of vibration of said apparatus are above about 2 kHz.

43. A rigid unitary mount base serving as a platform for an external cavity laser apparatus, said mount base comprising:

a rigid, unitary plate of metal having a natural mode of vibration above about 2 kHz; and at least one cradle extending form a surface of said plate, each said cradle having a curvilinear support dimensioned to interface with a substantial portion of a peripheral surface of an optical component to be mounted to said base.

44. The mount base of claim 43, wherein said metal is aluminum nitride.

45. The mount base of claim 43, wherein each said cradle is integral with said plate.

46. The mount base of claim 45, wherein said rigid unitary mount base, including said cradles, comprises aluminum nitride.

47. The mount base of claim 43, wherein at least one of said cradles is fixed to said plate.

48. The mount base of claim 47, wherein at least one of said cradles comprises stainless steel.

* * * * *